United States Patent [19]

Davidson et al.

[11] 3,952,231

[45] Apr. 20, 1976

[54] FUNCTIONAL PACKAGE FOR COMPLEX ELECTRONIC SYSTEMS WITH POLYMER-METAL LAMINATES AND THERMAL TRANSPOSER

[75] Inventors: Lewis A. Davidson, Reston; Michael C. Duffy, Vienna; Alvard J. Erickson, Reston, all of Va.; Gerard R. Gunther-Mohr, Chappaqua; Richard A. Williams, Candor, both of N.Y.

[73] Assignee: International Business Machines Corporation, Armonk, N.Y.

[22] Filed: Sept. 6, 1974

[21] Appl. No.: 503,883

[52] U.S. Cl. ............................. 317/100; 339/17 C; 317/101 CM; 174/16 HS
[51] Int. Cl.² ......................................... H05K 7/20
[58] Field of Search .......... 339/17 C, 17 L, 17 LM; 357/74, 80, 81, 84; 317/100, 101 D, 101 CP, 101 CM, 101 CC, 101 CE; 29/577, 626, 627; 174/68.5, 35, DIG. 3, DIG. 5, 15 R, 16 R

[56] References Cited
UNITED STATES PATENTS

| | | | |
|---|---|---|---|
| 3,705,332 | 12/1972 | Parks | 317/101 CM |
| 3,719,860 | 3/1973 | Lawrence | 317/100 |
| 3,726,002 | 4/1973 | Greenstein | 317/100 |
| 3,757,175 | 9/1973 | Kim | 317/101 |
| 3,764,856 | 5/1972 | Martin | 317/100 |
| 3,774,078 | 11/1973 | Martin | 317/100 |
| 3,777,220 | 12/1973 | Tatusko | 317/101 CM |
| 3,777,221 | 12/1973 | Tatusko | 317/101 CP |

Primary Examiner—Gerald P. Tolin
Attorney, Agent, or Firm—Joseph C. Redmond, Jr.

[57] ABSTRACT

The package comprises a plurality of metal/polymer laminates whereby electronic components or functional units may be directly attached or plugged into laminated elements to form a unitary package. An element or thermal transposer is included in the package to minimize thermal expansion mismatch between the components and the laminates and conduct thermal energy away from the attached electronic components. The polymer laminates are selected to have a configuration and thermal coefficient of expansion (TCE) that will permit the insertion and locking of materials within the laminates to form the unitary package. A wide variety of components and functional units having different electrical, thermal characteristics may be included in the package. The package is amenable to mass production processes that may be controlled by a designer to obtain packages at low cost, more flexibility and suitable for complex electronics system.

13 Claims, 9 Drawing Figures

FIG. 1A
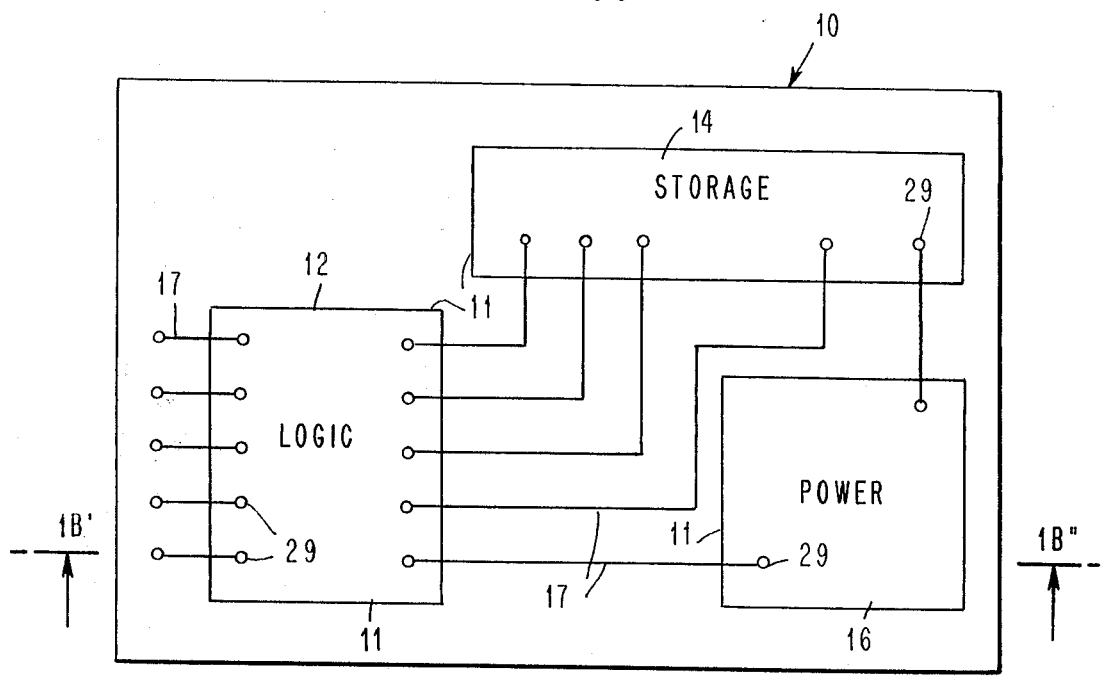
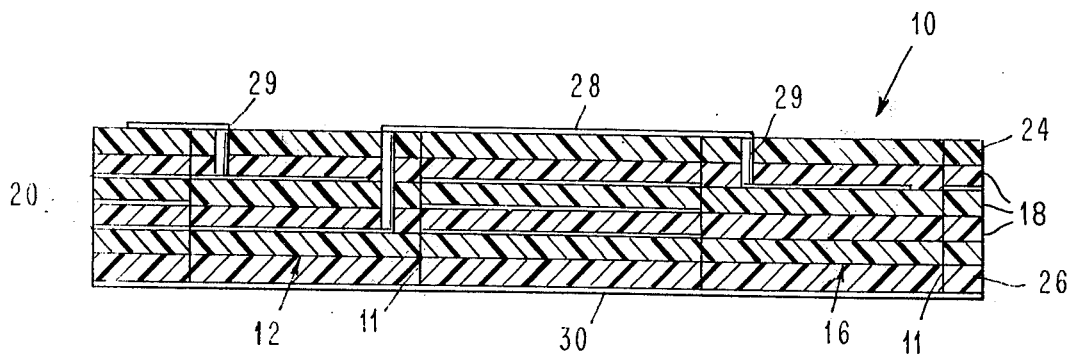
FIG. 1B

FUNCTIONAL PACKAGE FOR COMPLEX ELECTRONIC SYSTEMS WITH POLYMER-METAL LAMINATES AND THERMAL TRANSPOSER

BACKGROUND OF THE INVENTION

1. Field of the Invention

The invention relates to electrical packages and processes of fabrication thereof. More particularly, the invention relates to integrated circuit packages for fabricating one or more components or electronic functional units as a unitary member.

2. Description of the Prior Art

Complex electronic systems e.g. central processing units, multiplexors, channels and the like, are assembled by combining pluggable modules, printed circuit cards and printed circuit boards in a frame. U.S. Pat. No. 3,300,686 to A. H. Johnson, et al, assigned to the same assignee as that of the present invention, shows pluggable modules attached to a printed circuit card which in turn is attached to a printed circuit board as a part of a complex electronic system. The modules, cards and boards are usually identified as first, second and third level packaging, respectively. Large scale integration (LSI) now permits many electrical elements to be combined in a small semiconductor device. LSI offers the possibility of eliminating at least one level of packaging in complex electronic systems. The assembly of a large number of electrical elements as circuits into a single module presents problems relative to (1) connecting the module to other modules in assembling the complex electronic system, (2) combining modules of different electrical characteristic, cost and technology e.g. LSI, discrete devices, and (3) dissipating the heat associated with the modules to prevent damage to the module, package or the system. U.S. Pat. No. 3,777,220, assigned to the present assignee, addresses the solution of the foregoing problems, in part. Additional improvement, however, is still required in LSI packaging to overcome heat dissipation and prevent the generation of corrosive vapors from polymer materials which attack the package metallization and/or attached semiconductor devices. An electrical package that will overcome the heat dissipation, corrosion and other problems and be amenable to mass production manufacturing techniques will increase the availability of complex electronic systems to the scientific, educational, government and business communities.

SUMMARY OF THE INVENTION

An object of the invention is an electrical package that eliminates a level of packaging in complex electronic systems with improved heat dissipation qualities.

Another object is an electrical package that permits different components, modules and the like to be merged in a board of appropriate materials as a unitary member.

Another object is an electrical package that minimizes thermal coefficient expansion mismatch and maximizes heat dissipation among the materials, components and units of the package.

Another object is an electrical package that enables components, modules to be directly attached to a liminated member which minimizes generation of corrosive vapors in a package for a complex electronic systems.

Another object is an electrical package for a complex electronic system that suitably combines a plurality of electrical packages of different materials, electrical and thermal properties in a structurally strong package that aids in dissipating thermal energy from directly attached semiconductors and other components.

Still another object is a process for fabricating packages for complex electronic systems whereby the packages are amenable to mass production technique which may be readily designated by a designer of the package to achieve a desired cost, performance and reliability.

In an illustrative embodiment, a glass epoxy frame is laminated on both sides with a metallic member, typically copper, as conductor planes. The glass epoxy frame serves as a strong mechanical foundation for the package. The bottom side of the frame may be successively coated with glass epoxy laminates and copper laminates depending upon the wiring complexity and density of integrated circuit devices or modules that are joined to the package. The top or other side of the glass epoxy frame is covered by a thermal transposer and alternate glass epoxy and copper laminates, the latter providing additional conductor planes for subsequently attached integrated circuit devices or modules. The thermal transposer has a thermal coefficient of expansion that is closer to the semiconductor material of the integrated devices than that of the glass epoxy. The transposer lessens the thermal mismatch between the glass epoxy laminates and the attached integrated devices or chips. A material having the desired thermal characteristic as a transposer is a nickel-iron alloy which serves to prevent expansivity mismatch between the attached integrated circuit devices and the glass epoxy laminates. Via holes are drilled through the laminated members and appropriately plated to make connection with selected metal laminates. The via holes are insulated from the transposer and selected copper laminates as required. Heat pipes may be appropriately connected to the transposer for dissipating heat emanating from circuit elements. Conductive patterns are formed in the top metal laminate by additive or subtractive processes. The integrated circuit device(s) is attached to the conductive pattern by well known interconnection techniques. The device is enclosed in a suitable enclosure. A coating of urethane varnish, epoxy or parylene coating may be applied as an encapsulate for the integrated circuit devices and laminated members.

As another illustrative embodiment, as epoxy glass frame and web with preformed windows receives ceramic substrates having circuit patterns thereon. Glass epoxy and metallic laminates are successively applied to both sides of the epoxy glass frame and web with ceramic inserts. The outer copper layers are subtractively or additively processed to define circuit patterns. Via holes are installed in the laminates and plated to create connections between the outer and inner circuit patterns on the ceramic inserts. An integrated circuit device is attached to the circuit patterns on the ceramic inserts after removing the polymer and other material in a preselected area of the insert. The integrated circuit device may be enclosed in a container suitably attached to the outer epoxy laminate.

One feature of the invention is a first or webbed member and second or insert members that are combined as a unitary package, the first and second members having thermal coefficients of expansion that are selected to lock the second member within the first member with changes in ambient temperature.

Another feature of the invention is a plurality of laminar polymer/metal materials assembled as unitary member to permit direct attachment of electronic components and/or functional units of different electrical, thermal characteristics whereby a metal transposer among the laminates minimizes thermal expansion mismatch between the directly attached components/functional unit and the laminated member.

Another feature is a laminated member of polymer/metal material for receiving directly attached integrated circuit devices and including thermal conducting paths for increasing heat dissipation from the devices.

Still another feature is a process for selectively combining polymer/metal materials in an assembly by mass production processes that may be readily controlled by a designer to achieve a package of complex electronic systems at desired cost and reliability.

BRIEF DESCRIPTION OF THE DRAWINGS

These and other objects, features and advantages of the invention will be described in conjunction with the appended drawing in which:

FIG. 1A is a plan view of a printed circuit board incorporating metal/polymer circuit cards in accordance with the principles of the invention.

FIG. 1B is a cross sectional view of FIG. 1A along the line 1B' and 1B''.

DESCRIPTION OF THE PREFERRED EMBODIMENT

Figure 2A:
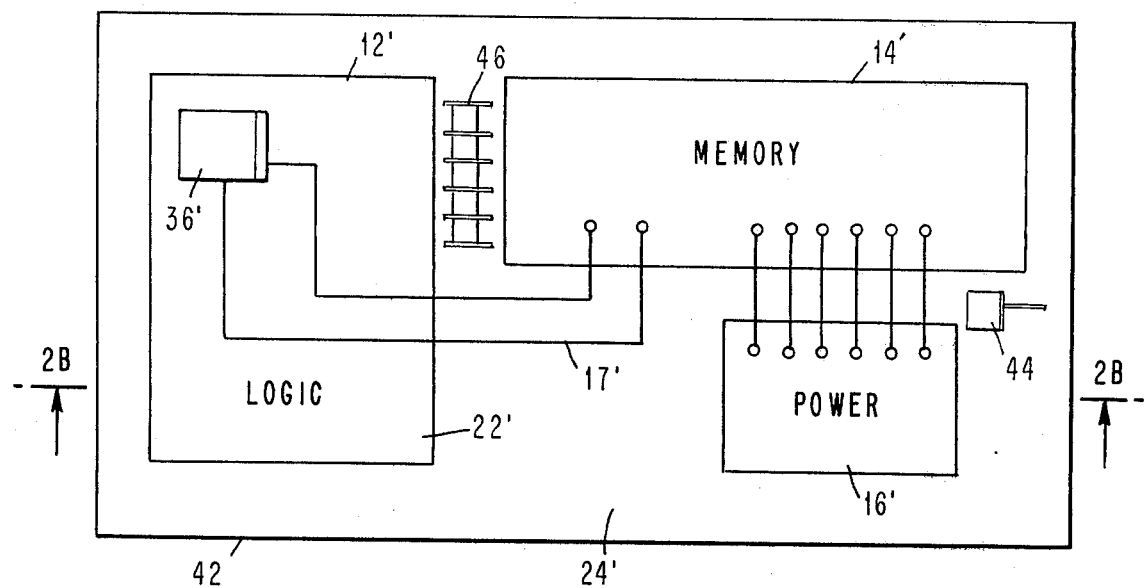
FIGS. 2A and 2B are plan and cross sectional views a support board of a first material and circuit cards of a second material incorporated in the support board of the first material.

FIG. 1A shows a support or printed circuit board 10 having openings 11 to incorporate a plurality of metal/polymer circuit cards 12, 14 and 16 as a unitary package. The cards may be adapted to package similar or different functions of a data processing system. As an example, card 12 is adapted to package logical element e.g. LSI gate devices (not shown) and interconnecting circuitry to perform various logical functions. Card 14 is adapted to package storage elements e.g. memory arrays (not shown) and interconnecting circuitry for reading/writing of digital information. Card 16 is adapted to package power elements e.g. regulator circuits (not shown) and interconnecting circuitry to provide operating power to the cards 12 and 14. The board 10 provides circuitry 17 to interconnect the cards together and electrical connections to other boards.

FIG. 1B shows that the board and cards comprise a plurality of organic insulating members 18, typically a polymer e.g. glass epoxy or epoxy paper or a polyimide material, that are laminated together to form an overall thickness of the order of about 30 mils. Both the board and the cards contain metal planes 20 between the laminations 18, according to their need for electrical signal or power distribution. The cards may also be a multilayered ceramic member as well as a multilayered organic member, as will appear herein after.

The board 10 is assembled from laminations 18. Openings 11 (also see FIG. 1A) are made in the board to receive the respective cards 12, 14 and 16 after their assembly. Insulating members 24 and 26, typically of the same material as the cards and boards, are disposed on the top and bottom surfaces of the combined board and card structure. Surface conductor planes 28 and 30 are disposed to overlie the covering insulating layers 24 and 26, respectively. The members 24, 26, 28 and 30 are laminated with the board 10 and cards 12, 14 and 16 to form a unitary and mechanically strong assembly. The surface conductor planes 28 and 30 are suitably formed into conductor patterns 17, as shown in FIG. 1A. Via holes 29 are drilled and plated in the cards to interconnect internal conductor planes with the surface conductor pattern. Details of the fabrication and assembly of the board and cards will be given in conjunction with the description of FIG. 5.

Figure 2B:
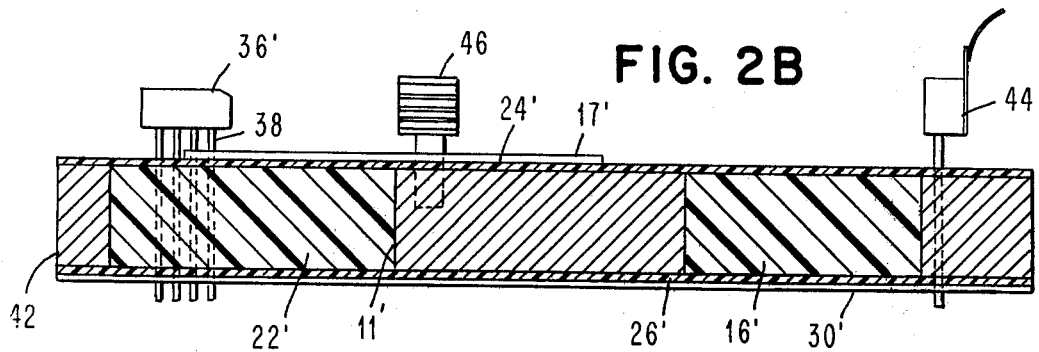

FIGS. 2A and 2B show another assembly incorporating the principles of the invention of FIGS. 1A and 1B. A metallic grid or web 42, typically aluminum is stamped or otherwise formed into an appropriate shape with appropriate size openings 11' to receive the cards 12', 14' and 16'. Elements in FIGS. 2A and 2B corresponding to those in FIGS. 1A and 1B have the same reference characters but are primed. Insulating liminates 24', 26' and surface conductor planes 17 and 30' are appropriately laminated to the grid 42 and cards 12', 14' and 16', as shown in FIG. 2B. A module element 36' is appropriately joined electrically and mechanically, to the card 12', after formation of via holes and the surface conductor plane into appropriate conductor patterns 17'. The module 36' includes an integrated device (not shown) and terminals 38, the latter being soldered or crimp, joined to the via holes 29' (not shown).

FIG. 2B also shows an appropriate connector assembly 44 as a means for providing input/output signals to the various functional units 12', 14' and 16'.

The metal grid 42 provides (1) mechanical strength to the assembly and (2) a thermal path for conducting heat from the modules 36' to an appropriate heat transfer element. In one form, a thinned metal radiator element 46 may be attached to the grid 42 after drilling through the members 24' and tapping the grid 42. Obviously, a number of alternatives are available to further distribute or increase the thermal dissipation from the element(s) 36'.

Figure 2C:
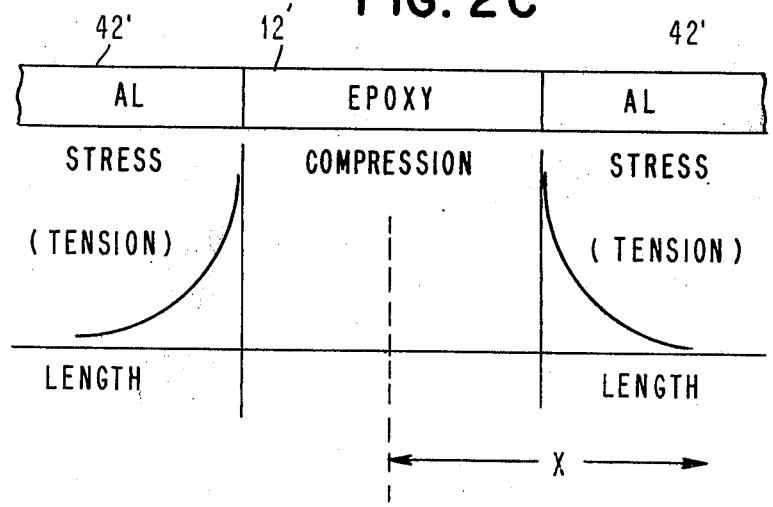
FIG. 2C is a schematic of stress/compression conditions within the structure in FIG. 2B at intersections of the first and second materials within the structure.

The assembly of FIGS. 2A and 2B is different from the assembly of FIGS. 1A and 1B in that the board and cards are of different materials. The selection of the proper board and card materials is very significant to a unitary and mechanically strong assembly. The thermal coefficient of expansion (TCE) of the board and cards must be appropriately related to insure the boards and cards do not separate as changes in temperature occur. Generally, the board or host member must have a TCE that is greater than or equal to the TCE for the cards. FIG. 2C shows an aluminum board 42' and a glass epoxy card 12'. When the members 42 and 12' are thermally laminated together the larger TCE of aluminum (24 microinches per °C) than that for the epoxy (17 microinches per °C) results in the member 12' being compressively locked in the aluminum member 42 by reason of the difference of TCE's. The thermal lamination process which is conducted at approximately 500 PSI and 194°C places the aluminum in tension. The stress condition of the aluminum applies a compressive force to lock the member 12' within the aluminum board. Empirical data indicates the stress in the aluminum is proportional to the relationship $1/X2$ where $X$ is the distance along the length of the assembly as measured from the center of the compressed epoxy member. A relatively rapid diminution of the aluminum stress lessens the possibilities of the propagation of cracks throughout the grid. The bond between the members 12' and 42 is further enhanced by pre-etching the aluminum prior to laminating with the covering insulating layers 24', 26' (see FIG. 2B). The laminated members 24' and 26' flow into the micropores of the aluminum to enhance the adhesive bond.

Figure 3A:
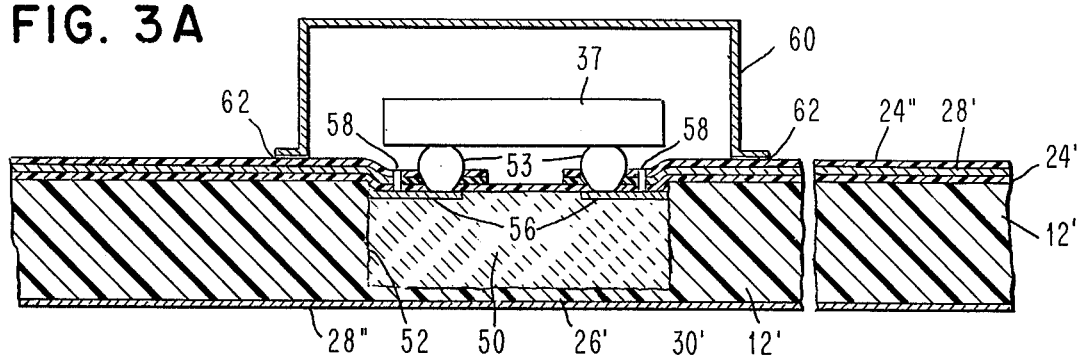
FIG. 3A is a cross sectional view of a support board of a first material incorporating a circuitized card of a second material.
Figure 3B:
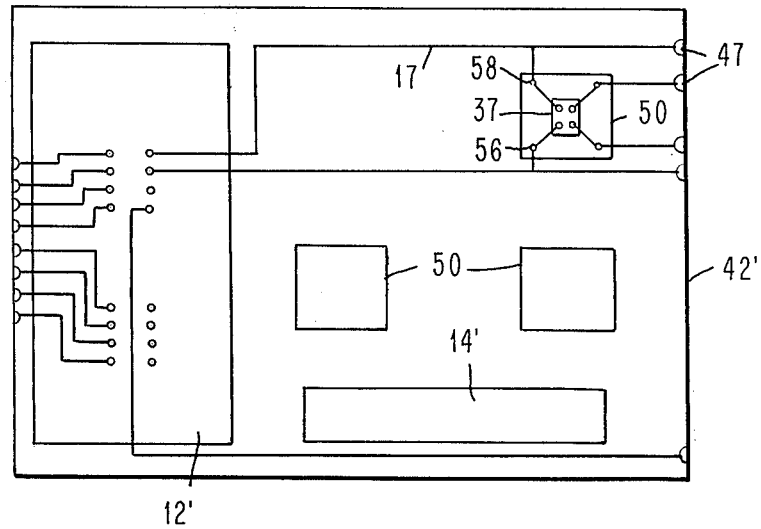
FIG. 3B is a partial top view of FIG. 3A.

FIGS. 3A and 3B show another assembly of different materials which have appropriate TCE's to permit the fabrication of unitary and mechanically strong assemblies. An active element 37 e.g. an integrated device may be directly attached to the assembly without the use of terminals 38 as in the assembly of FIG. 2B. The device 37 may be connected by soldering or wire bonding to surface conductors 28'. Details for soldering are described in the IBM Technical Disclosure Bulletin of May 1973, page 3837. Details for wire bonding of chips are given in U.S. Pat. No. 3,256,465 issued Apr. 14, 1966. The direct device or chip attachment to the assembly facilitates mass production manufacture of complex electronic units. Board and card fabrication, assembly and direct device or chip attachment are each individually and collectively suitable for mass production techniques with resultant low cost, high reliability and flexibility in manufacturing.

One problem encountered in direct chip attachment to the assembly is the significant difference in TCE's between the device or chip 37 and a card 12' or the like. FIG. 3A shows a ceramic member 50, typically alumina (although a suitable metal or alloy typically nickel-iron, KOVAR, INVAR is appropriate as a substitute for alumina) disposed in the card beneath the device 37. The member 50 is scored along the sides 52 to permit the glass epoxy to flow along the sides thereof to form a strong bond after a laminating process. The TCE for alumina is of the order of 6 microinches per °C. The member 50 is laminated in the member 12' by overlying and covering insulating layer 24' and 26' and surface conductor planes 28' and 30' at a pressure of approximately 500 PSI and a temperature of 194°C. The thickness of layer 24' is critical to controlling TCE mismatch in the assembly. The thickness of 24' should be of the order of 2-4 mils to have the member 50 control the TCE of the package. The laminating process places the member 50 in compression because of the larger expansion of the member 12' as discussed in conjunction with FIG. 2C. The chip or device 37 which has a TCE of approximately 5 microinches per °C can now be readily attached to the assembly without significant thermal mismatch with the member 12'. In the absence of the member 50, direct attachment of the chip or device 37 to the member 12' produces a significant TCE mismatch that creates sufficient sheer stresses in pads 53 to disconnect the device or chip from the assembly by repeated thermal stress.

The member 50 may be fabricated with or without a circuit pattern 56. The pattern 56 may be adhered to the member 50 by well known thick film processes, as described in U.S. Pat. No. 3,547,604 issued Dec. 15, 1970, assigned to the same assignee as that of the present invention or thin film processes, described for example in the article entitled "A Fabrication Technique for Multilayer Ceramic Modules" by H. D. Kaiser, et al, Solid State Technology, May 1972, pages 35–40. Insulating laminates 24', 24" and conductor plane 28' cover the member 50. Appropriate openings are made in the laminate 24' to permit connections between pads 53 of element 37 and the circuit pattern 56. Plated via holes 58 in the laminate 24' connect the circuit pattern 56 to the surface conductors 17' (see FIG. 3B) formed in the conductor plane 28'. The circuit pattern 56 facilitates the distribution of signals between the chip 37 and the circuit conductors 17'. The circuit pattern 56 may be put down at a spacing between conductors of the order of 5 mils and distributed to the surface conductors 17' through appropriate via holes 58 at a spacing of the order of 100 mils. The surface conductors on the card 12' and epoxy board 10' may be easily distributed to input/output terminals 47 at a spacing of the order of 6 mils.

The directly attached chip or device 37 may also be protected during handling by enclosing within a container 60. A sealing element 62, typically an epoxy O-ring may be adhered to the card to permit the container 60 to be joined to the assembly. A number of mass production processes are available for properly placing and sealing containers to the enclosed chip as shown in FIG. 3A.

Figure 4:
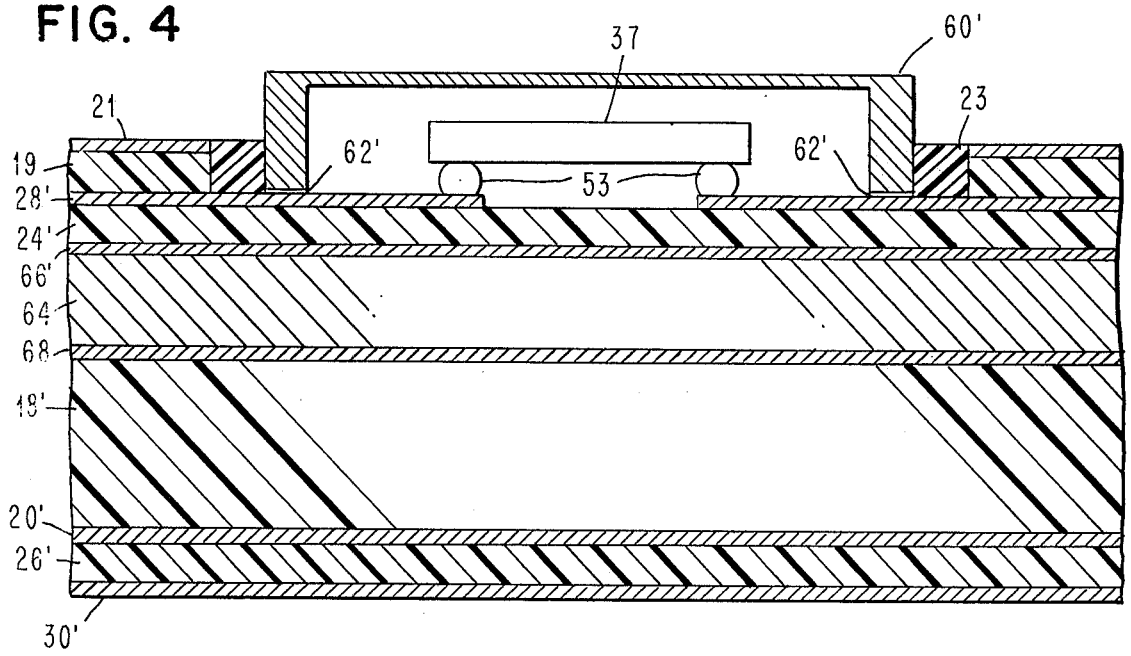
FIG. 4 is a cross sectional view of a metal/polymer circuit card and a laminate as a thermal coefficient of expansion transposer to compensate for expansion mismatch between the card and the directly attached semiconductor chip.

FIG. 4 shows a portion of a card for insertion into an opening of an epoxy board 10 (see FIGS. 1A, 1B) or metal grid 42 (see FIGS. 2A, 2B). The card is arranged for direct attachment of a chip or device 37. The card is made in the usual manner as described in conjunction with the FIGS. 1A through 3B except a thermal transposer laminate 64 is included. The transposer 64 is double clad with planes 66 and 68 e.g. copper to lower electrical resistance of laminate 64. The thermal transposer laminate 64 is selected to be of a material that closely matches the TCE of the element 37. One transposer that has been found to be suitable is a material designated 42 alloy (ASTM/F-30) which is a binary nickel-iron alloy intended primarily for controlled expansion application in electronics. The material has been found to be suitable for mass production lamination processes when selected to be of an appropriate thickness. One thickness found to be appropriate is that of 0.01 inch. The TCE of the material 64 varies from 4.0 to 7.4 $\times 10^{-6}$ centimeters per centimeter per °C. The material 64 has a closer expansivity device match than alumina (TCE = 6) thereby improving fatigue life for the pads 53. Additionally, the transposer 64 can serve as a thermal path for conducting heat from the device 37. The card may be drilled to permit connection of heat radiators 46, as shown and described in conjunction with FIG. 2B. Additionally insulating 19 and conductor 21 overlays may be adhesively added to the assembly for additional circuit planes, as required. A cast insulating stop 23 surrounds the top 60 to prevent short circuiting of such planes.

The finished board and cards of FIGS. 1A, 2A, 3A and 4 may be passivated by means of urethane varnish, epoxy or parylene coating (not shown). The passivating coating preserves the integrity of the surface conductors on the board and cards as well as the circuit patterns on the members 50.

Figure 5:
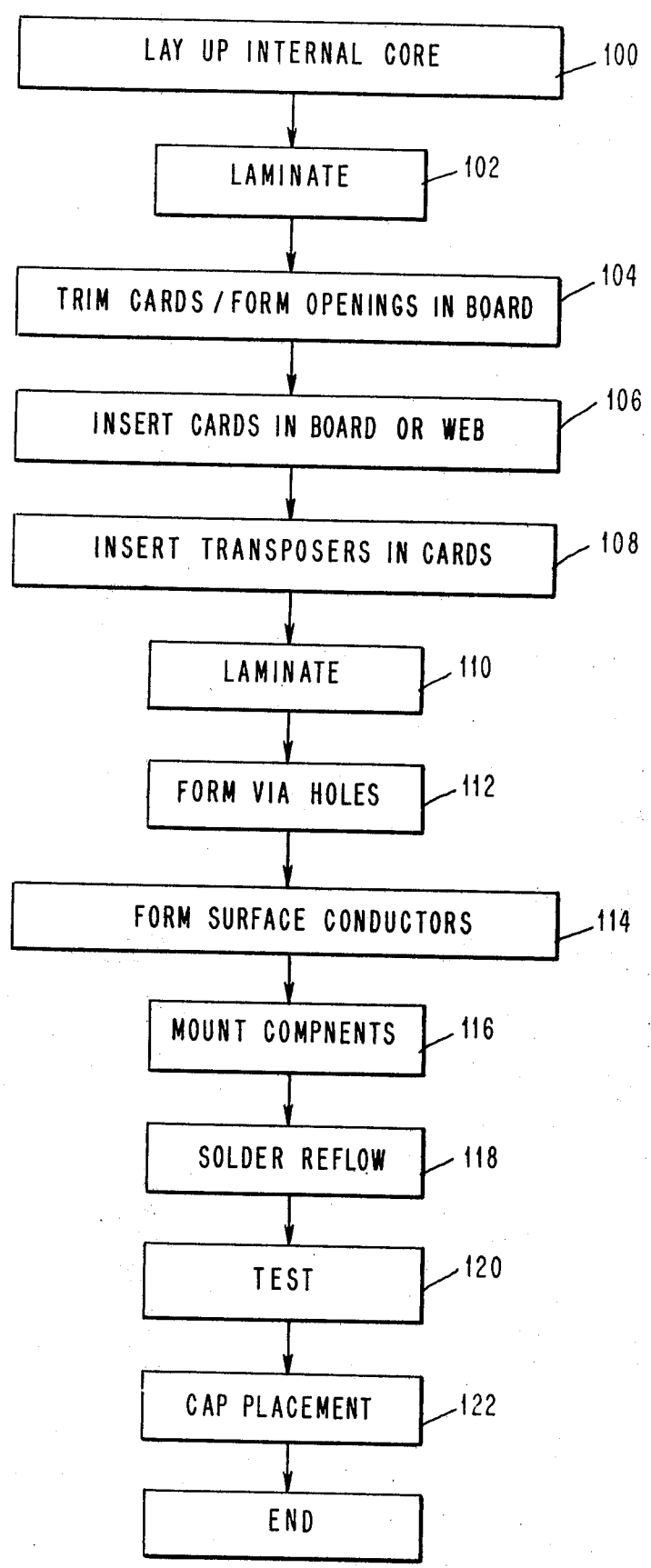
FIG. 5 is a flow diagram of a process for forming a printed circuit board and card for assembly into the structure of FIGS. 1A and 1B.

The process of fabricating a card or board, as shown in FIG. 5, is initiated with an operation 100 which places a plurality of insulating polymer laminates, typically glass epoxy or paper epoxy or polyimide material of the order of 4 mils thickness in a stacked column. Polyimide laminates are preferred where a package is to be employed in temperature/pressure environments which could initiate evaporation from the laminates of compounds injurious to metalization or attached chip devices, etc. It has been found that some laminating materials, particularly glass epoxy include curing agents e.g. aliphatic amine which at temperatures exceeding 72°F emit corrosive vapors that adversely affect the package metalization and/or attached chip devices. The proper selection of insulating laminate material for a package is a significant aspect of the invention. The laminate should provide TCE characteristics compatible with the attached semiconductor material and not emit vapors that adversely affect the metalization, semiconductor or other elements of the package. Metal laminates 20 (see FIGS. 1A and 1B), typically copper of the order of 1.4 mils thickness are interleaved among the insulating laminates 18 in accordance with the required ground/signal planes for the cards and board. The stacked insulating and metal laminates for the board and cards are laminated in an operation 102. Alternatively, the polymer laminates may be formed with deposited metal or otherwise adhered to one or both surfaces thereof. Details of the apparatus for laminating stacked columns of insulating and metal or metalized laminates are given in U.S. Pat. Nos. 3,319,317 or 3,465,435, assigned to the same assignee as the present invention. In the present instance, one set of laminating conditions found to be appropriate are a pressure of the order of 500 PSI and temperature of the order of 194°C. In an operation 104, the card members are trimmed and openings are formed or punched in the boards, according to the number of cards to be included. The edges of the cards may be scored to increase the surface area of the cards for better engagement with the board when brought together. The cards are inserted in the openings of the epoxy board in an operation 106. Alternatively a metal grid 42 may be stamped or otherwise formed into the configuration desired for the assembly. The grid surface is suitably etched to improve the adhesion of overlying laminates. An operation 108 is conducted to form openings within the cards to receive thermal transposers, e.g. alumina or like inserts with or without circuit patterns thereon. Various mechanical operations may be employed to form the openings in the cards. Alternatively, the cards may be fabricated with a recess or opening therein to receive the insert. The inserts are suitably scored along the sides to improve adhesion with the card during subsequent laminations. As another alternative, a metal alloy laminate may be included as a thermal transposer in a laminated epoxy board without openings therein. An operation 110 places the cards and board between additional insulating and metal laminates of appropriate dimensions and thickness. The operation 110 laminates the board and cards into an integral, mechanically strong and interlocking assembly. The assembly is formed by laminating the board/card and outer laminations at an appropriate pressure and temperature, as previously described. Via holes are formed in the cards in an operation 112 by drilling the card at appropriate locations. The via holes are plated in conventional electroless or electroplate processes. The surface conductor plane is additively plated or subtractively etched using well known processes 114 to form the appropriate surface conductors. Components are attached to the cards by various means including soldering, wire bonding in an operation 116. The conductors on the card are appropriately exposed to permit connections with the component. An operation 118 performs a solder reflow connection of the component terminals or pads of the card conductors. Appropriate testing 120 is performed on the board and cards and a container is placed over components, as required, in an operation 122.

While the invention has been shown and particularly described with respect to preferred embodiments, it is readily apparent to a worker skilled in the art that other forms and materials may be utilized in the invention without departing from the spirit and scope thereof.

What is claimed is:

1. A functional package for complex electronic systems comprising,
   a. a first member including a wiring plane and an opening,
   b. an electrical package including polymer and metal laminates united as a composite and disposed in the opening of the first member,
   c. a thermal transposer and heat conducting member included in the package, and
   d. means for uniting and wiring together the first member and the electrical package as a unitary structure.

2. The functional package of claim 1 further including head radiator means connected to the thermal transposer and the first member is a polymer web.

3. The functional package of claim 1 wherein the first member is an appropriately webbed metal frame.

4. A functional package for complex electronic systems comprising,
   a. a first polymer support member including a wiring plane and an opening,
   b. an electrical package including polymer and metal laminates united as a composite and disposed in the opening of the first member,
   c. means for uniting the electrical package and the first member as a unitary structure,
   d. a semiconductor element attached to the electrical package, and
   e. transposer means included in the electrical package to conduct thermal energy away from the semiconductor element and compensate for thermal coefficient expansion (TCE) mismatch between the semiconductor element and the electrical package.

5. The functional package of claim 4 wherein the transposer means has a TCE that is less than that of the first member.

6. The functional package of claim 4 wherein the transposer means is a laminate included in the electrical package beneath and insulated from the semiconductor element.

7. The functional package of claim 6 wherein the laminate is a metal alloy having a TCE approaching that for a semiconductor.

8. The functional package of claim 7 wherein a thermal radiator is connected to the metal alloy and further contributes to the removal of heat from the semiconductor.

9. A functional package for complex electronic systems comprising
 a. a first supporting member,
 b. a second member including polymer and metal laminates and a thermal transposer and heat conducting element united as a composite,
 c. an electrical component directly attached to the second member, and
 d. means for uniting the first and second members together as a composite functional package.

10. The functional package of claim 9 wherein the first member is of a material that has high thermal conduction properties.

11. The functional package of claim 9 wherein the first member is of a metallic material and the thermal transposer and heat conducting element is connected to a heat radiator.

12. A functional package for complex electronic systems comprising
 a. a first metal support member having high thermal conductive and expansion properties, a heat radiator element attached to the metal support member,
 b. a multi-layer conducting member, the member including insulating layers between the conductors,
 c. the insulating material being of a composition that will not emit injurious vapors to conductive and semiconductive materials at temperatures exceeding ambient,
 d. the multi-layer conducting member further including thermal transposer and heat conducting elements therein,
 e. means for uniting the first and multi-layer members together as a composite functional package, and
 f. a semiconductor device attached to the multi-layer conducting member.

13. The package of claim 12 wherein the insulating material is a polyamide.

* * * * *